United States Patent [19]

Bossaert

[11] Patent Number: 4,551,679
[45] Date of Patent: Nov. 5, 1985

[54] METHOD OF TOMOGRAPHIC SCANNING OF AN OBJECT BY NUCLEAR MAGNETIC RESONANCE

[75] Inventor: Jean Bossaert, Paris, France

[73] Assignee: Thomson-CSF, Paris, France

[21] Appl. No.: 493,965

[22] Filed: May 12, 1983

[30] Foreign Application Priority Data

May 14, 1982 [FR] France ............................... 82 08483

[51] Int. Cl.[4] ........................................... G01R 33/08
[52] U.S. Cl. .................................... 324/309; 324/307
[58] Field of Search ................ 324/300, 307, 309, 311

[56] References Cited

U.S. PATENT DOCUMENTS 4,115,730 9/1978 Mansfield ............................ 324/309

FOREIGN PATENT DOCUMENTS 2026172 1/1980 United Kingdom .
2079946 1/1982 United Kingdom .
2082775 3/1982 United Kingdom .

Primary Examiner—Michael J. Tokar
Attorney, Agent, or Firm—Roland Plottel

[57] ABSTRACT

In a method of direct line-by-line acquisition of an image by nuclear magnetic resonance, each line is selected at the intersection of two planes in which the atoms of the selected element such as hydrogen, for example, have been successively excited in order to produce a spin echo, said echo phenomenon being produced solely by the atoms of said line. The selection planes are separate and distinct from the tomographic plane.

9 Claims, 5 Drawing Figures

FIG_1
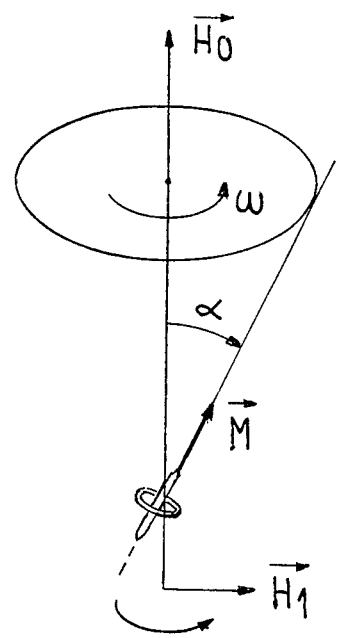
FIG_2
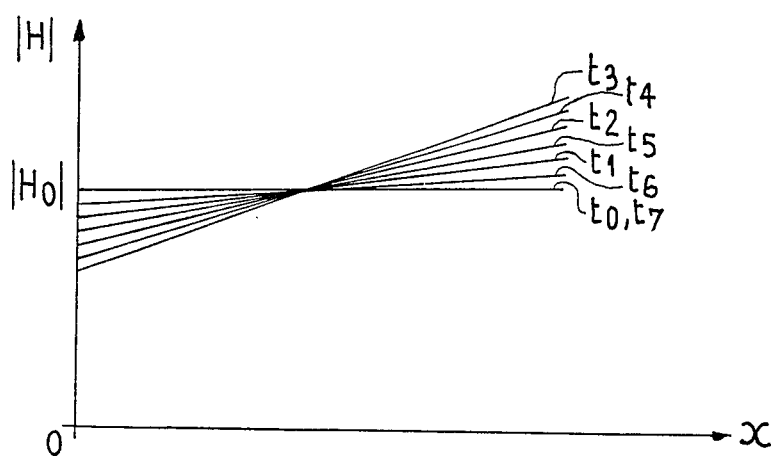

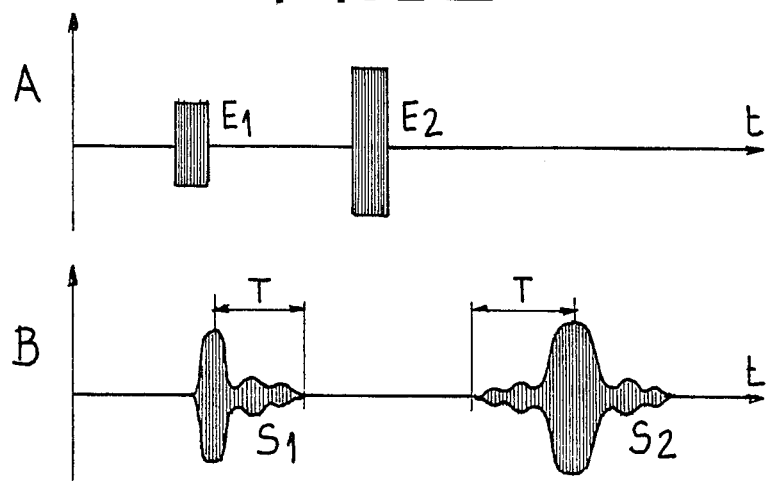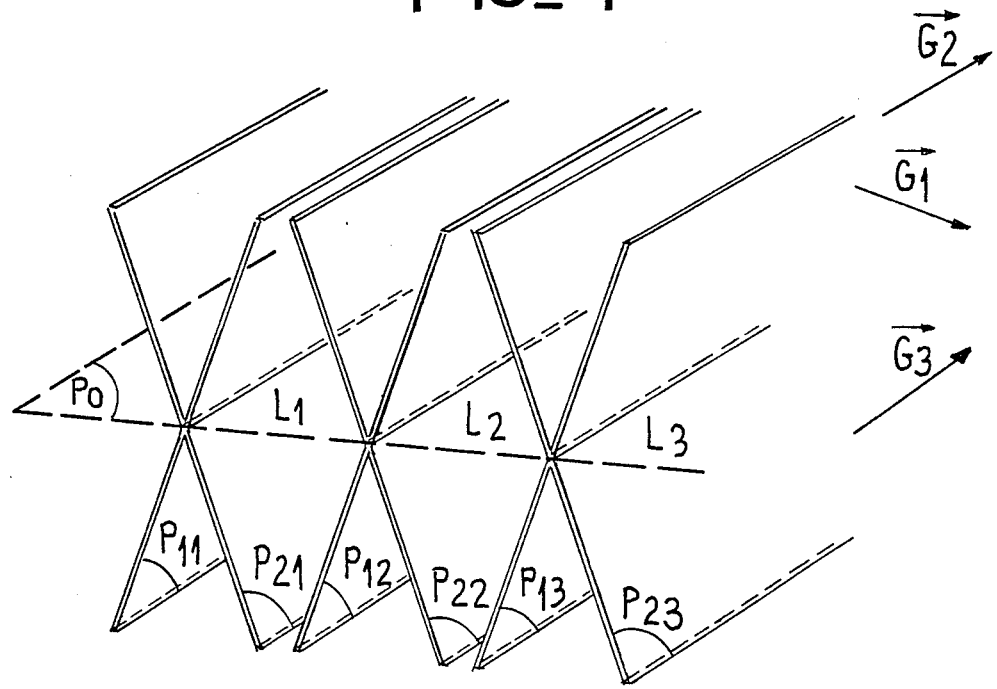

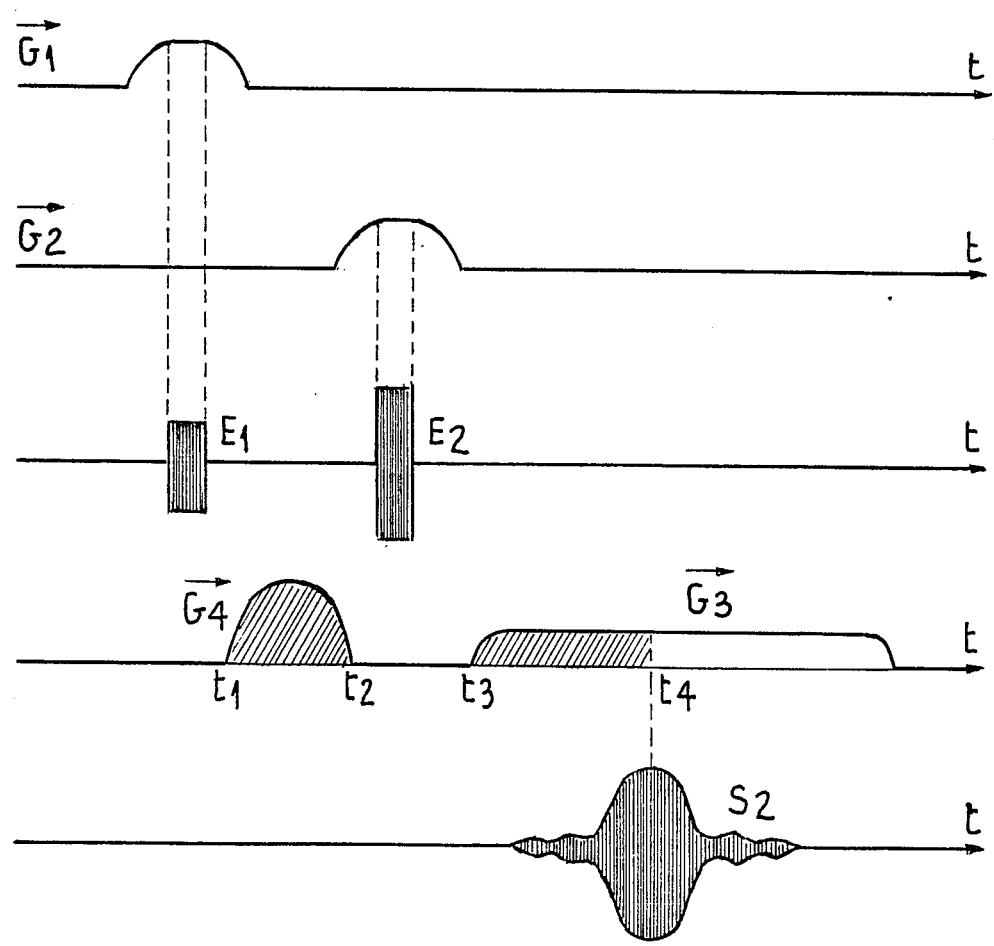

METHOD OF TOMOGRAPHIC SCANNING OF AN OBJECT BY NUCLEAR MAGNETIC RESONANCE

This invention relates to a method of tomographic scanning of an object by nuclear magnetic resonance and is more particularly directed to rapid acquisition of the image of the selected cross-section.

As is already known, it is possible to reconstruct the image of the cross-section of an object by measuring the nuclear paramagnetism of the atoms of a selected element of said object (such as hydrogen, for example). This result is subject, however, to the need to initiate a phenomenon of magnetic resonance of the nuclei of these atoms (since the effects produced by nuclear paramagnetism are so small that they can be detected only by means of a resonance phenomenon) and to measure the effects of the rotating magnetic field emitted by the nuclei which have thus been excited. The spectral characteristics of the field emitted as feedback make it possible to deduce the distribution of atoms of the element chosen in the object under study and therefore to obtain an image of the internal structure of said object.

In order to reconstruct an image, it is possible for example, at the same time as the excitation, to induce the resonance only in one plane of the object by superimposing a magnetic field gradient on the directive field in which the object is placed, and to split-up the signal produced by the selected plane into a certain number of lines by superimposing another magnetic field gradient while at the same time measuring the resonance phenomenon and by performing a Fourier analysis of the received signal.

It should be noted at this juncture that the "planes" mentioned in this description necessarily have a certain thickness. These cross-section planes are in fact "slices" localized in the space in which the directive field is located, the object to be studied being placed within said field. Similarly, a "line" defined at the intersection of two "planes" is in fact a volume of small cross-sectional area which extends in a predetermined direction in space. The first gradient mentioned above (emission gradient) is applied at right angles to the selected plane whilst the second gradient mentioned above (gradient on reception) is applied in a direction parallel to this latter. However, although it is possible to differentiate a plurality of lines by Fourier analysis, it is not possible in a single step to separate the different points (that is to say the different elementary volumes) of these lines. It is therefore necessary to proceed in much the same manner as the method employed in X-ray tomodensitometers. The phenomenon is repeated several times by changing the direction of the gradient on reception each time and by applying an algorithm for reconstruction of the image of the plane.

Another known method described by Hutchison and Mallard consists in measuring and analyzing, not the signal received at the end of the excitation, but its spin echo which is produced under particular conditions. Spin echo is a well-known phenomenon which is evidenced by the reappearance of the nuclear magnetic resonance signal, especially when the nuclei have been subjected to at least two successive excitation sequences.

As in the previous method, the cross-section or tomographic plane is selected during a first excitation by application of a gradient at the same time as the excitation.

The intensity and duration of the first excitation are so determined as to ensure that the magnetic moments tilt through an angle of 90° in the tomographic plane. Another gradient is then applied parallel to the tomographic plane in a selected direction for the purpose of inducing phase shifts between the magnetic moments associated with different "lines" of the plane. It is therefore possible by this means to define a plurality of lines in the tomographic plane before applying to this latter the second excitation whose intensity and duration are so determined as to produce an additional tilt of the magnetic moments through an angle of 180° in order to produce a subsequent spin echo. A gradient which is parallel to the tomographic plane and perpendicular to the gradient which has produced the phase shifts between lines is applied simultaneously with the reception of the spin echo. Fourier analysis of the spin echo signal is not always sufficient to split-up the responses from the different points of the different lines in a single step. It is necessary to repeat the aforementioned elementary cycle several times and to change each time, not the direction, but the value of the gradient which induces phase shifts between lines. This method also has recourse to a reconstruction algorithm which is relatively complex since the analyzed spin echo signal is representative of all the magnetic moments of the tomographic plane. Said spin echo signal is fairly weak.

It is also worthy of note that, in these two types of method according to the prior art, tomography is always performed in a plane selected during an excitation phase. It is consequently necessary to observe a quiescent period corresponding to the relaxation time of the element considered, after each elementary cycle, in order to allow the magnetic moments of the atoms of the plane selected each time to return to their state of equilibrium. If this quiescent period (which can be of the order of one second) is not observed, the signal is considerably weakened at the point of reception and becomes unusable. The time required in order to acquire the necessary number of lines for reconstructing an image may therefore attain several minutes, which is an exacting requirement, The method in accordance with the invention permits removal of all these disadvantages. In particular, said method makes it possible to obtain a spin echo signal which is directly representative of one line of the tomographic plane, with the result that the Fourier analysis of said signal permits direct reconstruction of the image of said line without any need to use a complex reconstruction algorithm. Furthermore, the invention is also directed to a method in which it is unnecessary to observe the quiescent period mentioned above after acquisition of each line.

With this object in mind, the invention is therefore concerned with a method of tomographic scanning of an object by nuclear magnetic resonance, which consists in producing a nuclear magnetic resonance phenomenon in the atoms of a selected element of said object which is placed in a directive magnetic field, then in measuring the characteristics of the rotating magnetic field radiated by said atoms in order to deduce therefrom a representation of their distribution within said object. The invention essentially consists in reconstructing an image line by line by choosing each line at the intersection of two planes selected by two magnetic field gradients applied respectively at the same time as two successive excitation sequences capable of subsequently producing a spin echo phenomenon and by measuring said echo phenomenon in order to acquire said line.

In a preferred embodiment of the method, two planes are selected respectively from two groups of planes at each cycle of acquisition of a line, the two planes selected each time being separate and distinct from all the others in order to ensure that the surface defined by all the lines of intersection of the planes selected in pairs does not coincide with any of said planes. The planes of one and the same group are substantially parallel to each other.

Other features of the invention will be more apparent upon consideration of the following description and accompanying drawings, wherein:

FIG. 1 illustrates the conventional behavior of the macroscopic resultant of the magnetic moments of a group of atomic nuclei in the presence of a nuclear magnetic resonance phenomenon;

FIG. 2 is a diagram illustrating the progressive variation of a magnetic field gradient in time and space;

FIG. 3 is a diagram illustrating the conventional conditions of production of a spin echo phenomenon;

FIG. 4 illustrates the mode of selection in accordance with the invention of the lines of the tomographic plane;

FIG. 5 is a chronogram illustrating a cycle of acquisition of a line in accordance with the principle of the invention.

It is recalled that the observation of a nuclear magnetic resonance phenomenon presupposes the existence of a powerful constant magnetic field $H_0$ or so-called directive field in which the object to be examined is placed and of a rotating field $H_1$ or so-called exciting field of lower strength which is at right angles to the directive field $H_0$ and the angular velocity of which is located within the radiofrequency range. When the exciting field $H_1$ is not present, the macroscopic resultant M of the magnetic moments of a group of nuclei finds a position of equilibrium parallel to the directive field $H_0$. It is demonstrated that, in the presence of the exciting field $H_1$, the motion of said macroscopic resultant M is comparable with the motion of the axis of a gyroscope. This is illustrated in FIG. 1.

In other words, if it is necessary to reconstruct an image of a selected cross-section of an object, it may be considered that each small elementary volume of said object corresponding to one point of definition of the image is modelized (from the point of view of nuclear magnetic properties) by a small magnetized gyroscope. A study of the movements of these gyroscopes under the conditions indicated in the foregoing will give indications in regard to the concentration of the atoms of the element under study in the different elementary volumes of the object, this particular element (namely hydrogen in the majority of instances) being selected from the others by choosing the angular velocity of the exciting rotating field $H_1$. In the vicinity of nuclear magnetic resonance, the rate of precession $\omega$ of the macroscopic resultant M depends on the value of the directive field. The angle of tilt $\alpha$ depends on the intensity and the duration of the exciting field.

In practice, a basic structure for producing an image and utilizing the phenomenon of nuclear magnetic resonance comprises means designed to produce a constant and powerful magnetic field (the directive field $H_0$) within a given space in which the object to be studied is placed, excitation coils which receive a radiofrequency signal and are placed within said space in order to produce the exciting field $H_1$, provision being made for receiving coils which are capable of detecting the weak rotating field emitted as feedback by the excited nuclei.

The installation is completed in addition by means for establishing magnetic field gradients in selected directions of the space and at desired moments. An installation of this type is conventional and therefore not illustrated in the accompanying drawings. By reason of the weakness of the rotating feedback field, the operation is carried out sequentially so as to ensure that the field radiated by the nuclei is not masked by the presence of the exciting field $H_1$. The initial step therefore consists in exciting the nuclei of the selected element by applying a radiofrequency signal to the excitation coil and the radiated field is measured at the end of the excitation period, the magnetic moments being then in a state of free precession. In fact, at the time of disappearance of the excitation radiofrequency signal, the magnetic moments are all inclined at an angle $\alpha$ with respect to the directive field and rotate at the angular velocity $\omega$. The free precession continues during a period of time which is still relatively long before the magnetic moments revert to their position of equilibrium in a direction parallel to the directive field. The signal developed at the terminals of a receiving coil decreases substantially exponentially.

If the directive field $H_0$ is completely uniform, all the atoms of the selected element contained in the object which is placed within said field react to the excitation field provided that this latter has the correct angular velocity. It is nevertheless preferable to have the possibility of selecting at least one plane of the object since it is sought to obtain an image of a cross-section of said object. The conventional practice consists in selecting this plane at the same time as the sequence of excitation by superimposing on the directive field $H_0$ a weaker field which varies linearly within the space and therefore a field gradient $\Delta H_0$ which is oriented in a selected direction of the space. The result thereby achieved is that the object placed within said space is virtually split-up into parallel planes which are located at right angles to the direction of the gradient and in respect of which the modulus of the total field $H=(H_0+\Delta H_0)$ is constant. As a consequence, a predetermined resonance frequency corresponds to each of these planes and only the particular plane which is "tuned" to the frequency of the exciting field is subjected to a magnetic resonance phenomenon and is therefore capable of radiating a measurable rotating field.

This field gradient is of the form $(\Delta H_0)t$. More specifically, it is generated only during a given time interval which is longer than (and includes) the period during which the exciting field is applied. FIG. 2 shows the progressive variation of the total field H during this time interval in the direction of application of the gradient, for example a direction Ox. It is apparent that, at successive instants $t_0$, $t_1$, $t_2$ ... $t_6$, $t_7$, the field H varies linearly in space with a slope which increases progressively from a uniform distribution $H_0$, attains a maximum value at the instant $t_3$ and subsequently decreases again to zero at the instant $t_7$. The excitation field is generated during a short time interval (in the vicinity of the instant $t_3$) during which the gradient is substantially stabilized.

However, the fact of having selected a plane during the excitation is not sufficient to reconstruct an image of said plane since the signal received after the excitation stage is representative of the response of all the excited nuclei in this plane and does not make it possible to deduce immediately the distribution of nuclei in said plane.

It is a known practice to distinguish different parallel lines in said plane by establishing a gradient of the same type as the gradient described earlier during the reception and in a direction of said plane perpendicular to the direction of the parallel lines which it is sought to distinguish.

Under these conditions, the value of the modulus of the total field H is constant in respect of each line of the plane. Since the rate $\omega$ of free precessional motion of the gyroscopes is directly dependent on the value of the total field in which they are located, it follows that all the gyroscopes associated respectively with the different points of one and the same line radiate a rotating field at a characteristic angular velocity which is different from that of the adjacent line. The signal detected at the time of reception is therefore the resultant of a mixture of frequencies and the Fourier spectrum of said signal makes it possible to discern the "response" of the different lines of the plane in a given direction of said plane since a given frequency of the Fourier transform of the signal corresponds to each line. It is only necessary to resume the same excitation-reception operations by changing the direction of the gradient in reception each time with a view to acquiring data which are sufficient for reconstruction of an image by applying an algorithm which is similar to that employed in a tomodensitometer.

The method described by Hutchison and Mallard, mentioned earlier, utilizes a spin echo phenomenon which is well known and can be explained as follows. At the end of an excitation stage, all the elementary macroscopic resultants M have tilted through the same angle $\alpha$ which is dependent on the excitation time and on the intensity of the exciting field $H_1$. It may be postulated, for example, that the axes of the gyroscopes have all tilted through 90° and rotate in phase at the same velocity $\omega$. A signal representing the resultant of these movements is sensed by the measuring coils at the very start of reception, that is to say just after disappearance of the exciting field. As already mentioned, this signal is damped fairly rapidly. It is important to note that this fast signal decay does not mean that the magnetic moments have been restored to their state of equilibrium (a much longer period is necessary in order to reduce the angle of inclination to zero). Said fast signal decay is produced by a progressive phase shift of the precessional movements of the magnetic moments which rotate at sufficiently different velocities with respect to each other. In consequence, the resultant of the sensed rotating field rapidly falls to zero.

However, the different "gyroscopes" continue to rotate with substantially the same inclination with respect to the total field H. If the exciting field is reapplied with an intensity and during a period which are adapted to produce an additional tilting motion of all the "gyroscopes" through an angle of 180° beyond the angle which they had attained after the initial application of the exciting field, the relative phase shifts of the "gyroscopes" then undergo a progressive variation in the opposite direction with respect to the direction followed prior to reversal. This accordingly results in another phase synchronization corresponding to the previous state of said gyroscopes at the end of the first application of the exciting field. A usable signal therefore appears and this signal follows "symmetrically" the progressive variation of the signal which appeared at the end of the first application of the exciting field. In other words, the amplitude of said signal increases to a maximum value, then re-decreases and finally falls to zero as a result of a further phase deviation of the "gyroscopes" in free precessional motion.

FIG. 3A illustrates the two radiofrequency emissions $E_1$, $E_2$ applied to a coil which is capable of producing the exciting field $H_1$ whilst FIG. 3B shows the waveform of the signals $S_1$, $S_2$ which can be collected at the terminals of a receiving coil. The first signal $S_1$ having a time-duration T is detectable immediately after the first radiofrequency emission $E_1$ whilst the second spin echo $S_2$ appears a moment after the second radiofrequency emission $E_2$. Said signal $S_2$ is shown with an amplitude which is double that of the emission $E_1$ and with the same time-duration.

In accordance with the invention, the known phenomenon which has just been described by way of reference to the prior art permits the successive selection of two planes. It is in fact only necessary to produce two magnetic field gradients G1 and G2 of the type described with reference to FIG. 2 at the same time as the two radiofrequency emissions $E_1$ and $E_2$ respectively. This is illustrated in FIG. 5. Under these conditions, the "gyroscopes" of the line of intersection of the two selected planes will alone give rise to a spin echo signal such as the signal $S_2$. Another gradient is applied parallel to said line at the time of reception and the image of the points of said line can be obtained directly by Fourier analysis of the echo signal. A set of parallel lines acquired in this manner permits reconstruction of an image. In addition to the advantage arising from the fact that it permits direct line-by-line acquisition of the image, the invention also has the advantage of avoiding the need to wait for all the "gyroscopes" to be restored to their state of equilibrium after each elementary cycle which finally results in acquisition of a line.

To this end, the cross-section surface defined by all the lines of intersection of the planes selected in pairs never coincide with any of these planes. Thus it is not necessary to wait after acquisition of each line and the image can be reconstructed very rapidly, that is to say in a few seconds. More specifically, the acquisition of the different lines in accordance with the invention corresponds to the representation of FIG. 4. The respective directions of the two field gradients $G_1$ and $G_2$ define respectively two groups of parallel planes ($P_{11}$, $P_{12}$, $P_{13}$...) and ($P_{21}$, $P_{22}$, $P_{23}$...) which intersect in pairs in the tomographic plane $P_o$, the image of which is to be recorded. At each detection of a spin echo signal, the lines $L_1$, $L_2$, $L_3$... of the plane $P_o$ are therefore acquired successively. By way of example, the gradient $G_1$ is established at the moment of the first radiofrequency emission ($E_1$, FIG. 5) whilst the gradient $G_2$ is established at the moment of the second radiofrequency emission ($E_2$, FIG. 5). The gradient $G_3$ is established in a direction parallel to the lines $L_1$, $L_2$, $L_3$... during reception of the spin echo signal. Transition of a given plane ($P_{11}$) to the following plane ($P_{12}$) of the same group is preferably obtained by changing the frequency of the corresponding excitation radiofrequency signal (radiofrequency emission $E_1$), the gradient ($G_1$) being reapplied in the same manner at the time of selection of each plane of the same family. However, it is feasible to operate by means of a change in the total magnetic field H or by combining the two means.

The orientation of the gradients $G_1$ and $G_2$ in space defines the angle at which the selected planes are inclined and intersect each other in pairs. Since these planes have a predetermined thickness, it is apparent that a judicious choice of the direction of the gradients $G_1$ and $G_2$ in space will make it possible to determine the volume and shape of the selected line. Said volume (which also depends on the thickness of the planes) must not be too small in order to ensure that the corresponding spin echo signal remains measurable.

FIG. 5 summarizes the different stages of acquisition of a line in accordance with the invention, the field gradients $G_1$, $G_2$ and $G_3$ being established in accordance with the explanations given with reference to FIG. 2 and being oriented in space in accordance with FIG. 4.

A point worthy of note is that the application of the gradient $G_3$ after the second radiofrequency emission entails the need to apply a gradient having the same direction $G_4$ after the first radiofrequency emission in order to cause appearance of the spin echo. The time-integrated value of the gradient $G_4$ (from $t_1$ to $t_2$ in FIG. 5) is equal to the value of the gradient $G_3$ which is integrated to one-half the time-duration of the spin echo (from $t_3$ to $t_4$ in FIG. 5). Furthermore, it will prove advantageous to record the image from a plurality of interlaced fields. In fact, the magnetic moments of the adjacent atoms of a selected plane have inevitably been weakly "excited". It is therefore preferable to acquire a complete field of spaced lines in order to ensure that a time interval which is sufficient for return of these magnetic moments to their state of equilibrium is permitted to elapse prior to selection of the plane to which they belong.

With reference to FIG. 4, it is thus apparent that the lines $L_1$, $L_2$, $L_3$ ... form part of one and the same field. If provision is made for n fields, the lines are relatively spaced at a distance corresponding to $(n-1)$ fields. The successive fields can be displaced by a predetermined number of lines. By way of example, if $n=8$, each field can be displaced by three lines with respect to the preceding line, with the result that field interlacing can be represented as follows:

|1|4|7|2|5|8|3|6|1|

What is claimed is:

1. A method of tomographic scanning of an object by nuclear magnetic resonance, which consists in producing a nuclear magnetic resonance phenomenon in atoms of a selected element of said object which is placed in a directive magnetic field, then in measuring the characteristics of the rotating magnetic field radiated by said atoms in order to deduce therefrom a representation of their distribution within said object, wherein said method consists in reconstructing a tomographic image line by line by choosing each line at the intersection of two planes selected by two magnetic field gradients applied respectively at the same time as two successive excitation sequences which are capable of subsequently producing a spin echo phenomenon and by measuring said echo phenomenon in order to acquire said line, wherein two planes are selected respectively from two groups of planes at each cycle of acquisition of a line, the two planes selected each time being separate and distinct from all the others in order to ensure that the surface defined by all the lines of intersection of the planes selected in pairs does not coincide with any of said planes.

2. A method according to claim 1, wherein the planes of one and the same group are substantially parallel to each other.

3. A method according to claim 1 of the type which consists in producing the aforesaid spin echo phenomenon by superimposing an excitation rotating field on the aforesaid directive magnetic field during each excitation sequence, wherein transition from one plane to another plane of the same group is obtained by changing the angular velocity of said excitation rotating field.

4. A method according to claim 3, wherein transition from one plane to another plane of the same group is obtained by modifying the aforesaid directive magnetic field.

5. A method according to claim 1, wherein each line is acquired by applying a first field gradient in the direction of said line during appearance of said spin echo and by analyzing the Fourier transform of said echo.

6. A method according to claim 5, wherein a second field gradient is applied in the direction of said line between the two excitation sequences aforesaid, the time-integrated value of said second field gradient being substantially equal to the value of said first gradient which is integrated to one-half the time-duration of said echo.

7. A method according to claim 1, wherein the complete image is acquired in a number of interlaced fields.

8. A method according to claim 6, wherein two successively acquired fields are relatively displaced by a chosen number of lines.

9. A method according to claim 8, wherein the two first gradients aforesaid are oriented in space so as to ensure that the planes selected respectively by said gradients form a predetermined angle in pairs, thus contributing to adjustment of thickness of the tomographic cross-sectional plane.

* * * * *